United States Patent
Chin et al.

(10) Patent No.: US 10,069,442 B2
(45) Date of Patent: Sep. 4, 2018

(54) HEAT DISSIPATION DEVICE AND ELECTRONIC SYSTEM

(71) Applicant: COOLER MASTER CO., LTD., New Taipei (TW)

(72) Inventors: Te-Hsuan Chin, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 0 days.

(21) Appl. No.: 15/411,858

(22) Filed: Jan. 20, 2017

(65) Prior Publication Data

US 2017/0222575 A1 Aug. 3, 2017

Related U.S. Application Data

(60) Provisional application No. 62/290,467, filed on Feb. 3, 2016.

(51) Int. Cl.
| | |
|---|---|
| *H02N 11/00* | (2006.01) |
| *H02K 7/18* | (2006.01) |
| *H05K 7/20* | (2006.01) |
| *H01L 23/427* | (2006.01) |
| *F03G 7/06* | (2006.01) |
| *H02K 9/20* | (2006.01) |

(52) U.S. Cl.
CPC ............. *H02N 11/002* (2013.01); *F03G 7/06* (2013.01); *H01L 23/427* (2013.01); *H02K 7/1823* (2013.01); *H05K 7/20327* (2013.01); *H05K 7/20336* (2013.01); *H02K 9/20* (2013.01)

(58) Field of Classification Search
CPC ...... H05K 7/20; H05K 7/1823; H02K 7/1823; H02N 11/00
USPC ............... 361/700; 290/43, 54, 44; 219/631; 165/104.26
See application file for complete search history.

(56) References Cited

U.S. PATENT DOCUMENTS

| | | | | |
|---|---|---|---|---|
| 5,441,102 A | * | 8/1995 | Burward-Hoy | ....... F28D 1/0325 165/104.22 |
| 7,605,486 B2 | | 10/2009 | Bridwell | |
| 2007/0151969 A1 | * | 7/2007 | Tain | ...................... F01K 13/006 219/631 |

(Continued)

FOREIGN PATENT DOCUMENTS

| | | |
|---|---|---|
| TW | 200827553 A | 7/2008 |
| TW | I319048 B | 1/2010 |
| TW | 201239305 A1 | 10/2012 |

(Continued)

*Primary Examiner* — Mandeep S Buttar
(74) *Attorney, Agent, or Firm* — Muncy, Geissler, Olds & Lowe, P.C.

(57) ABSTRACT

A heat dissipation device applied to a heat source includes a heat conduction unit and a power generation unit. A fluid chamber and a rotor chamber are configured inside the heat conduction unit. The fluid chamber and the rotor chamber are communicated with each other. A working fluid is configured in the fluid chamber. The power generation unit has a rotor and a power generation module. The rotor is connected to the power generation module and is configured in the rotor chamber. The rotor is driven by the working fluid so as to enable the power generation unit to output electrical energy. An electronic system with the heat dissipation device is also disclosed.

8 Claims, 3 Drawing Sheets

(56) References Cited

U.S. PATENT DOCUMENTS

2008/0178589 A1* 7/2008 He .................. F03D 9/007
                                                    60/531
2014/0174701 A1* 6/2014 Kare ................ F28D 15/04
                                                    165/104.26

FOREIGN PATENT DOCUMENTS

TW        I387685 B     3/2013
TW        I392795 B1    4/2013

* cited by examiner

HEAT DISSIPATION DEVICE AND ELECTRONIC SYSTEM

CROSS REFERENCE TO RELATED APPLICATIONS

The non-provisional patent application claims priority to U.S. provisional patent application with Ser. No. 62/290,467 filed on Feb. 3, 2016. This and all other extrinsic materials discussed herein are incorporated by reference in their entirety.

BACKGROUND OF THE INVENTION

Field of Invention

The present invention relates to a heat dissipation device and, in particular, to a heat dissipation device with power generation function and an electronic system containing the heat dissipation device.

Related Art

In order to maintain the normal operation of an electronic device, a heat dissipation device is usually configured on the electronic element of the electronic device, which may be easily over heated. Although the conventional heat dissipation device can remove the heat generated by the heat source of the electronic device, the generated heat can only be dissipated but can't be recycled.

Therefore, it is an important subject to provide a heat dissipation device that can recycle the heat energy generated by the electronic device.

SUMMARY OF THE INVENTION

In view of the foregoing, an objective of the present invention is to provide a heat dissipation device and an electronic system with the heat dissipation device that can provide the heat dissipation function and recycle the heat energy generated by the electronic device.

To achieve the above objective, the present invention discloses a heat dissipation device applied to a heat source and including a heat conduction unit and a power generation unit. A fluid chamber and a rotor chamber are configured inside the heat conduction unit. The fluid chamber and the rotor chamber are communicated with each other, and a working fluid is configured in the fluid chamber. The power generation unit has a rotor and a power generation module. The rotor is connected to the power generation module and is configured in the rotor chamber. The rotor is driven by the working fluid so as to enable the power generation unit to output electrical energy.

In one embodiment, the heat conduction unit has a heat source end, a cooling end and a pipe wall disposed surrounding the fluid chamber.

In one embodiment, the heat conduction unit is a heat pipe. Two ends of the heat pipe are configured as the heat source end and the cooling end, and an opening is disposed at a side surface of the heat pipe for partially exposing the rotor from the rotor chamber. The opening is configured for communicating the fluid chamber and the rotor chamber.

In one embodiment, the heat conduction unit is a vapor chamber, and two opposite sides of the vapor chamber are configured as the heat source end and the cooling end.

In one embodiment, the heat conduction unit further includes a guiding plate disposed inside the heat conduction unit. The guiding plate and the pipe wall define the fluid chamber. The rotor is disposed inside the heat conduction unit and includes a plurality of blades, and the guiding plate isolates the fluid chamber from most parts of the blades.

In one embodiment, the heat conduction unit has a pipe wall configured with a capillary structure.

In one embodiment, the rotor is a centrifugal rotor.

In one embodiment, the power generation module includes an axis, a magnetic element, a stator coil and an output terminal. The rotor is pivotally disposed on the axis, and the magnetic element connects to the axis. The stator coil is magnetically coupled to the magnetic element. The output terminal connects to the stator coil for outputting the electrical energy.

To achieve the above objective, the present invention also discloses an electronic system, which includes a heat source, the above-mentioned heat dissipation device and an electronic element. The heat dissipation device is disposed on the heat source. The electronic element is electrically connected to the heat dissipation device and activated based on the electrical energy outputted from the heat dissipation device.

As mentioned above, in the heat dissipation device and electronic system of the invention, the fluid chamber and rotor chamber inside the heat conduction unit are communicated with each other, and the working fluid is configured in the fluid chamber. Besides, the rotor of the power generation unit is connected to the power generation module, and the rotor is disposed in the rotor chamber. When the heat conduction unit contacts with the heat source, the rotor can be driven by the working fluid so as to rotate the power generation unit to output electrical energy. Compared with the conventional art, the heat dissipation device of the invention can not only provide the heat dissipation function but also recycle the heat energy generated by the electronic device.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

The embodiments of the invention will be apparent from the following detailed description, which proceeds with reference to the accompanying drawings, wherein the same references relate to the same elements. Moreover, the drawings of all implementation are schematic, and they do not mean the actual size and proportion. The terms of direction recited in the disclosure, for example up, down, left, right, front, or rear, only define the directions according to the accompanying drawings for the convenience of explanation but not for limitation. When an element is disposed on, above, under or underneath another element, these elements can be contacted with each other or uncontacted with each other by configuring one or more additional elements between these two elements.

Figure 1A:
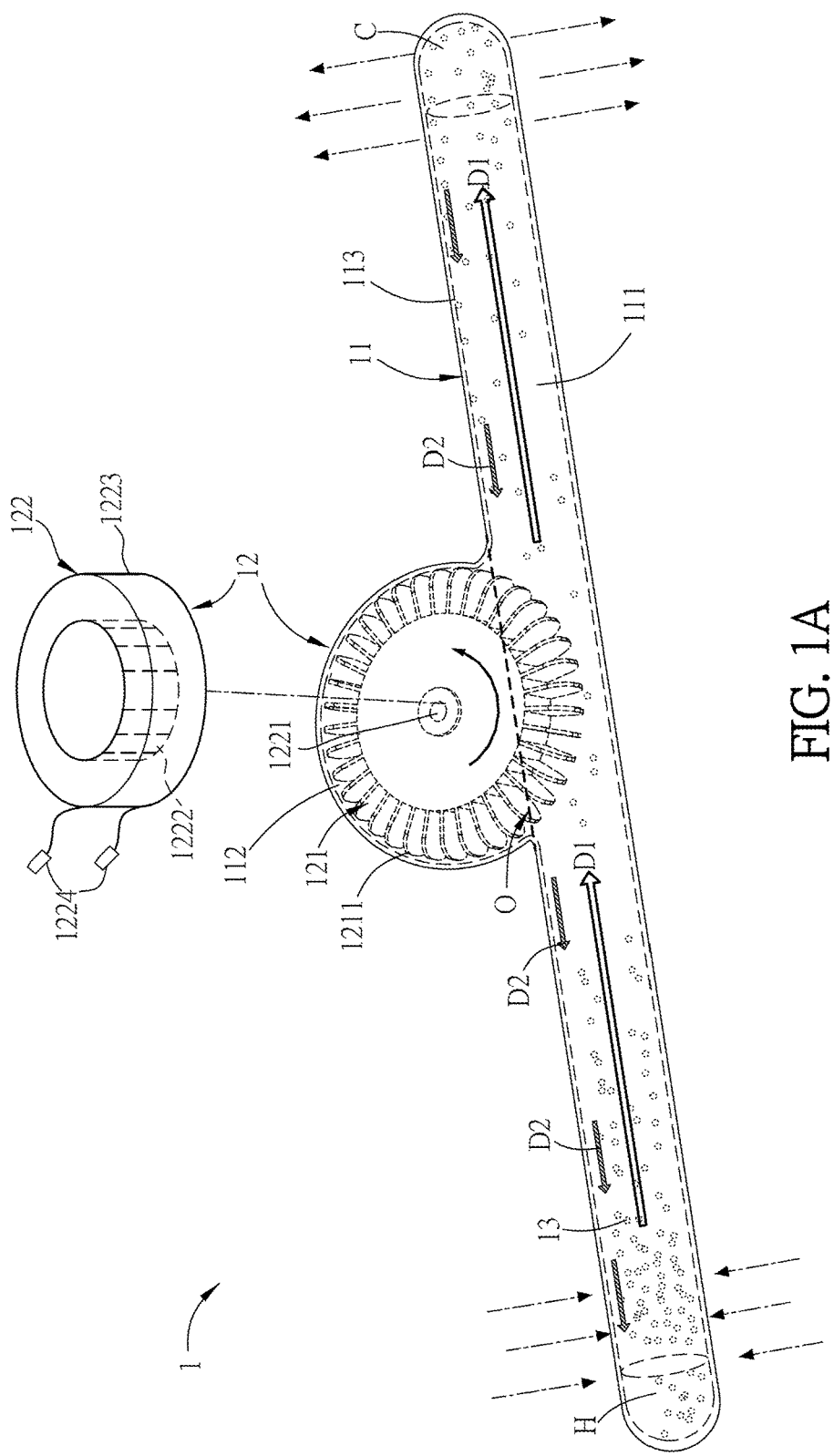
FIG. 1A is a perspective view of a heat dissipation device according to an embodiment of the invention.
Figure 1B:
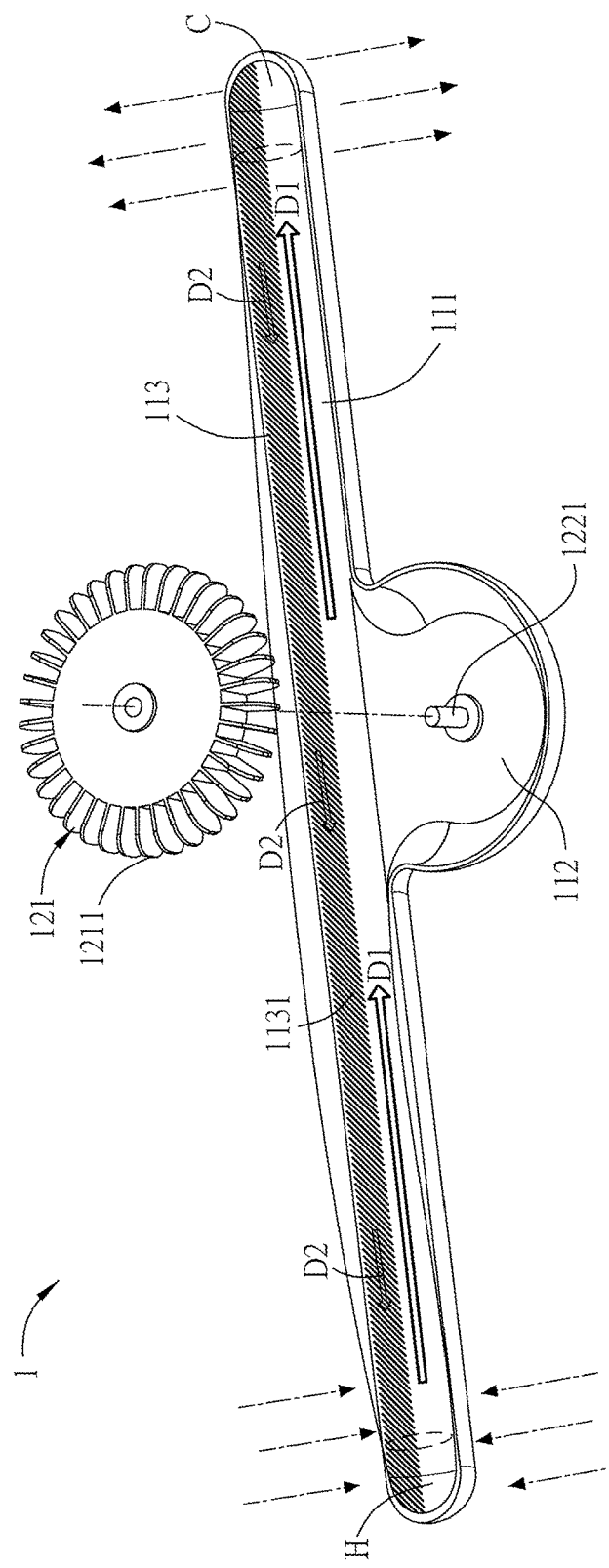
FIG. 1B is another perspective view of the heat dissipation device of FIG. 1A.

FIG. 1A is a perspective view of a heat dissipation device 1 according to an embodiment of the invention, and FIG. 1B is another perspective view of the heat dissipation device 1 of FIG. 1A. For the sake of describing the structure of the heat dissipation device 1, the length and shape of the heat dissipation device 1 are only for an illustration. To be noted, the length and shape of the heat dissipation device 1 can be properly designed based on the heat source and the environment.

In this embodiment, the heat dissipation device 1 is a liquid cooling type heat dissipation device. The heat dissipation device 1 is suitable for various kinds of electronic devices such as, for example but not limited to, a computer, power device, CPU, VGA, IC chip, motherboard, or lamp. In this embodiment, the heat dissipation device 1 is a heat pipe (or heat conduction pipe) with power generation function.

As shown in FIG. 1A, the heat dissipation device 1 is applied to a heat source and includes a heat conduction unit 11 and a power generation unit 12. In addition, the heat dissipation device 1 further includes a working fluid 13.

In this embodiment, the heat conduction unit 11 is a heat pipe (or a heat conduction pipe) having an enclosed chamber. The heat conduction unit 11 has a strong structure for sustaining different internal and external pressures. The material of the heat conduction unit 11 includes an intermediate material for conducting heat such as metal (e.g. copper, aluminum or titanium). A fluid chamber 111 and a rotor chamber 112 are configured in the enclosed chamber of the heat conduction unit 11. The fluid chamber 111 and the rotor chamber 112 are communicated with each other. In other words, the working fluid 13 can be injected into the fluid chamber 111, and is capable of flowing within the fluid chamber 111.

The power generation unit 12 has a rotor 121 and a power generation module 122. In this embodiment, the rotor 121 is an impeller configured with a plurality of blades 1211, and the rotor 121 is disposed in the rotor chamber 112. Herein, the impeller is a centrifugal structure, and some of the blades 1211 are disposed in the fluid chamber 111 of the heat conduction unit 11, and some of the blades 1211 are not disposed in the fluid chamber 111 of the heat conduction unit 11. That is, only a part of the blades 1211 can be pushed by the working fluid 13 in the fluid chamber 111 so as to rotate the rotor 121, and the residual blades are not directly pushed. Regarding to a single blade 1211, it will stay in the fluid chamber 111 for a period and then stay outside the fluid chamber 111 for a period during the rotation of the rotor 121. To be noted, the number and shape of the blades 1211 can be determined according to the balance and rotation speed of the rotor 121. The rotor 121 is connected to the power generation module 122 and can be driven by the working fluid 13 for enabling the power generation unit 12 to output electrical energy.

The heat conduction unit 11 (a heat pipe) may further include a pipe wall 113, which defines the fluid chamber 111. Besides, the heat conduction unit 11 further includes a heat source end H and a cooling end C, which are disposed at opposite two ends of the heat pipe (the heat conduction unit 11). In this embodiment, the two ends of the heat pipe are configured as the heat source end H and the cooling end C. The heat source end H is one end of the heat pipe closing to the heat source (not shown), and the cooling end C is one end of the heat conduction unit 11 away from the heat source. Moreover, the side surface of the heat pipe is configured with an opening O (the dotted line at the side surface of the heat conduction unit 11).

In this embodiment, the rotor chamber 112 is communicated with the fluid chamber 111 of the heat conduction unit 11 through the opening O. Accordingly, a part of the rotor 121 is exposed from the rotor chamber 112 through the opening O and then protruded into the fluid chamber 111. In this embodiment, only a part of the rotor 121 protrudes into the fluid chamber 111 through the opening O, and the residual part of the rotor 121 (including a part of the blades 1211) is still located in the rotor chamber 112.

The heat dissipation device 1 and the heat source can be connected by, for example but not limited to, a thermal conductive paste. In practice, the thermal conductive paste is applied on a heat source or the heat source end H of the heat conduction unit 11. Then, the heat dissipation device 1 and the heat source are assembled, so that the thermal conductive paste can contact with the heat source of the electronic device and the heat source H of the heat conduction unit 11. Accordingly, the heat dissipation device 1 can dissipate the heat from the heat source. Besides, the heat source end H and the cooling end C must be separated with a proper condensing distance. If the heat source end H and the cooling end C are too close, the gas type working fluid 13 can't be completely condensed to the liquid type. If the distance between the heat source end H and the cooling end C is too long, the gas type working fluid 13 can be completely condensed to the liquid type but it needs more time to flow back to the heat source end H. This will reduce the heat dissipation performance of the heat dissipation device 1.

The working fluid 13 is injected into the fluid chamber 111. The heat source end H of the heat conduction unit 11 is contacted with the heat source, so that the heat can be conducted to the heat source end H of the heat conduction unit 11 (see the arrow in figure). Accordingly, the temperature of the heat source end H is increased, and the working fluid 13 in the heat source end H is evaporated. In this embodiment, the working fluid 13 can be a refrigerant such as Freon, ammonia, acetone, methanol, ethanol, heptane, or water. Regarding to the kind or type of the electronic device, the selected working fluid 13 must be vaporizable at the heat source end H.

To be noted, before injecting the refrigerant (the working fluid 13) into the heat conduction unit 11, the heat conduction unit 11 should be vacuumed in advance. This step can remove the impure gas (e.g. air) from the heat conduction unit 11. The impure gas does not participate the evaporation-condensing cycle. In general, the impure gas can increase the evaporation temperature and will occupy a certain volume in the chamber of the heat conduction unit 11, which can affect the heat conduction efficiency of the heat conduction unit 11.

In addition, the power generation module 122 further includes an axis 1221 and a magnetic element 1222. The rotor 121 is pivotally disposed on the axis 1221, so that the rotor 121 can rotate about the axis 1221. The magnetic element 1222 connects to the rotor 121 through the axis 1221. In this embodiment, the rotor 121 is a non-axial-flow type centrifugal rotor structure. The axis 1221 is perpendicular to the flow direction D1 of the fluid chamber 111. In other words, the axis 1221 of the power generation module 122 is perpendicular to the flow direction D1 of the working fluid 13 (flowing from the heat source end H to the cooling end C). The axis 1221 is located in the rotor chamber 112 instead of the fluid chamber 111. In other aspects, the rotor 121 can be an axial-flow type rotor structure, and the entire rotor 121 is located in the fluid chamber 111. In this case, the axis 1221 is parallel to the flow direction of the working fluid 13.

When the heat dissipation device 1 is contacted with the heat source, the heat source end H of the heat conduction unit 11 has higher temperature, and the working fluid 13 at the heat source end H is evaporated. Then, the evaporated working fluid 13 flows along a flowing path (the flow direction D1) in the fluid chamber 111 and moves toward the cooling end C. The evaporated working fluid 13 can flow through the rotor 121 of the power generation unit 12 and push the blades 1211 to rotate the rotor 121, thereby activating the power generation unit 12 to generate electrical energy. In addition, the electrical energy generated by the power generation unit 12 can be stored or applied to other electronic element or device, such as fans, pumps or light modules. This can reduce the requirement for external power supply so as to save the total power consumption. Afterward, the working fluid 13 can carry the heat to the cooling end C so as to dissipate the heat at the cooling end C (see the arrow in figure).

As shown in FIG. 1B, the pipe wall 113 of the heat conduction unit 11 is further configured with a capillary structure 1131. In this embodiment, the capillary structure 1131 is disposed on the pipe wall 113 of the heat conduction unit 11 away from the power generation unit 12. The general designs of the capillary structure 1131 include the slot type, mesh type, fiber type and sinter type, and this invention is not limited. In practice, the sinter type capillary structure is preferred since the sinter type capillary structure can carry the condensed working fluid 13 back no matter the heat conduction unit 11 is placed in which angle. The other types of capillary structures still have limitations in positions and angles. Since the pipe wall 113 of the heat conduction unit 11 is configured with the capillary structure 1131, the condensed working fluid 13 can flow back to the heat source end H through the capillary structure 1131 (the flow direction D2). Accordingly, the working fluid 13 can cyclically flow in the heat conduction unit 11.

As shown in FIG. 1A, the power generation module 122 further includes a stator coil 1223 and an output terminal 1224. The magnetic element 1222 can be a magnet and connect to the axis 1221. The stator coil 1223 is disposed surrounding the magnetic element 1222 and connected to the output terminal 1224 for outputting the electrical energy. For example, the stator coil 1223 is disposed around the magnetic element 1222, and is located within the range capable of magnetically coupling to the magnetic element 1222. When the rotor 121 rotates, the magnetic element 1222 connected to the axis 1221 is rotated accordingly. Thus, the magnetic field of the rotating magnetic element 1222 can interfere the magnetic field of the stator coil 1223 so as to generate magnet variation, and the stator coil 1223 is magnetically coupled with the magnetic element 1222 to generate inducted current. Then, the inducted current can be outputted through the output terminal 1224.

As mentioned above, when the heat dissipation device 1 is contacted with the heat source, the heat source end H of the heat conduction unit 11 (heat pipe) has higher temperature, and the working fluid 13 at the heat source end H is evaporated. Then, the evaporated working fluid 13 flows along a flowing path (the flow direction D1) in the heat conduction unit 11 (heat pipe) and moves toward the cooling end C. The evaporated working fluid 13 can push the blades 1211 of the rotor 121 to rotate the rotor 121, thereby activating the power generation unit 12 to generate electrical energy. In addition, the working fluid 13 can carry the heat to the cooling end C so as to dissipate the heat at the cooling end C. Since the pipe wall 113 of the heat conduction unit 11 is configured with the capillary structure 1131, the condensed liquid working fluid 13 can flow back to the heat source end H through the capillary structure 1131 (flow direction D2). Accordingly, the working fluid 13 can cyclically flow in the heat conduction unit 11.

Figure 2:
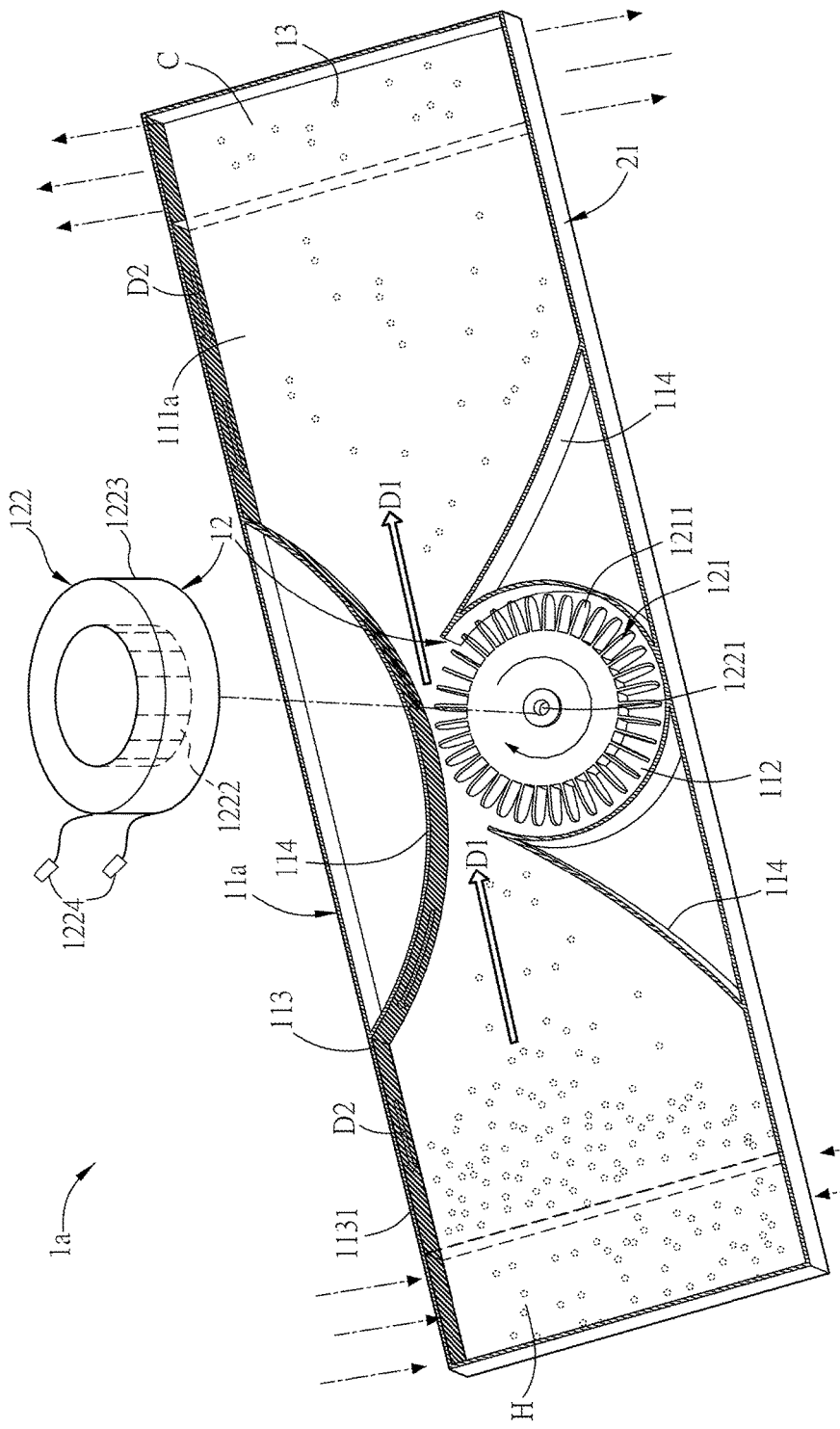
FIG. 2 is a perspective view of a heat dissipation device according to another aspect of the invention.

FIG. 2 is a perspective view of a heat dissipation device 1a according to another aspect of the invention.

In the heat dissipation device 1 of the previous embodiment, the heat conduction unit 11 is a cylinder tube, and it can conduct heat in one dimension. Different from the heat dissipation device 1 of the previous embodiment, the heat dissipation device 1a of this aspect includes a heat conduction unit 11a, which is a plate vapor chamber. The heat conduction unit 11a can conduct heat in two dimensions. In this embodiment, the vapor chamber is a high performance heat dissipation device for conducting the heat to a large-area plate, so that the heat dissipation device 1a can be applied to a more critical condition and have a better heat dissipation efficiency. Two opposite sides of the heat conduction unit 11a (vapor chamber) are configured as the heat source end H and the cooling end C. In this case, the heat conduction unit 11a (vapor chamber) is assembled by a plurality of metal plate by welding or is integrally formed as one piece with a vacuum chamber. This invention is not limited.

In this embodiment, the power generation unit 12 also includes a rotor 121 and a power generation module 122, and the rotor 121 is disposed in the rotor chamber 112. The rotor 121 and the rotor chamber 112 are totally disposed inside the heat conduction unit 11a (vapor chamber). In addition, the heat conduction unit 11a of the heat dissipation device 1a further includes at least one guiding plate 114 disposed inside the heat conduction unit 11a. The guiding plate 114 and the pipe wall 113 of the heat conduction unit 11a define the fluid chamber 111a. In this embodiment, one guiding plate 114 is configured above the heat conduction unit 11a, and two guiding plates 114 are configured underneath the heat conduction unit 11a. The two guiding plates 114 configured underneath the heat conduction unit 11a surround most part of the blades 1211 and separate the blades 1211 from the fluid chamber 111a. In practice, the two guiding plates 114 are disposed at two sides of the rotor chamber 112. Accordingly, a part of the blades 1211 is located in the fluid chamber 111a of the heat conduction unit 11a, and the residual part of the blades 1211 is still located in the rotor chamber 112. The configuration of the pipe wall 113 and the guiding plates 114 can form a narrower flowing channel between the rotor chamber 112 and the fluid chamber 111a. Thus, the working fluid 13 can have higher flowing speed in the narrower flowing channel of the fluid chamber 111a, thereby pushing the rotor 121 of the power generation unit 12 to rotate so as to generate electrical energy.

The other technical features of the heat dissipation device 1a can be referred to the above-mentioned heat dissipation device 1, so the detailed description thereof will be omitted.

When the heat dissipation device 1a is contacted with the heat source of the electronic device, the heat source end H of the heat conduction unit 11a (vapor chamber) has higher temperature, and the working fluid 13 at the heat source end H is evaporated. Then, the evaporated working fluid 13 flows along a flowing path D1 in the heat conduction unit 11 (vapor chamber) and moves toward the cooling end C. The evaporated working fluid 13 can be centralized to the blades 1211 based on the guiding plates 114 so as to push the blades

1211 to rotate the rotor 121, thereby activating the power generation unit 12 to generate electrical energy. The condensed liquid working fluid 13 can flow back to the heat source end H through the capillary structure 1131 (flow direction D2). Accordingly, the working fluid 13 can cyclically flow in the heat conduction unit 11*a*.

In addition, the present invention also discloses an electronic system such as a computer, power device, CPU, VGA, IC chip, motherboard, lamp or other electronic components, products and apparatuses that can generate heat. The electronic system includes a heat source and a heat dissipation device. The heat dissipation device is disposed on the heat source, so that the heat generated by the heat source of the electronic system can be dissipated by the heat dissipation device. The electronic element is electrically connected to the heat dissipation device and activated based on the electrical energy outputted from the heat dissipation device. The heat dissipation device can be the above-mentioned heat dissipation device 1 or 1*a*, or their modifications. The technical features thereof can be referred to the above embodiment, so the details will be omitted.

To sum up, in the heat dissipation device and electronic system of the invention, the fluid chamber and rotor chamber inside the heat conduction unit are communicated with each other, and the working fluid is configured in the fluid chamber. Besides, the rotor of the power generation unit is connected to the power generation module, and the rotor is disposed in the rotor chamber. When the heat conduction unit contacts with the heat source, the rotor can be driven by the working fluid so as to rotate the power generation unit to output electrical energy. Compared with the conventional art, the heat dissipation device of the invention can not only provide the heat dissipation function but also recycle the heat energy generated by the electronic device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat dissipation device applied to a heat source, comprising:
    a heat conduction unit, wherein a fluid chamber and a rotor chamber are configured inside the heat conduction unit, the fluid chamber and the rotor chamber are communicated with each other, and a working fluid is configured in the fluid chamber; and
    a power generation unit having a rotor and a power generation module, wherein the rotor is connected to the power generation module and is configured in the rotor chamber, and the rotor is driven by the working fluid so as to enable the power generation unit to output electrical energy;
        wherein the heat conduction unit has a heat source end, a cooling end and a pipe wall disposed surrounding the fluid chamber, the heat conduction unit is a heat pipe, two ends of the heat pipe are configured as the heat source end and the cooling end, an opening is disposed at a side surface of the heat pipe for partially exposing the rotor from the rotor chamber, and the opening is configured for communicating the fluid chamber and the rotor chamber.

2. The heat dissipation device of claim 1, wherein the pipe wall is configured with a capillary structure.

3. The heat dissipation device of claim 1, wherein the rotor is a centrifugal rotor.

4. The heat dissipation device of claim 1, wherein the power generation module comprises:
    an axis, wherein the rotor is pivotally disposed on the axis;
    a magnetic element connecting to the axis;
    a stator coil magnetically coupled to the magnetic element; and
    an output terminal connecting to the stator coil for outputting the electrical energy.

5. An electronic system, comprising:
    a heat source;
    a heat dissipation device disposed on the heat source and comprising:
        a heat conduction unit, wherein a fluid chamber and a rotor chamber are configured inside the heat conduction unit, the fluid chamber and the rotor chamber are communicated with each other, and a working fluid is configured in the fluid chamber, and
        a power generation unit having a rotor and a power generation module, wherein the rotor is connected to the power generation module and is configured in the rotor chamber, and the rotor is driven by the working fluid so as to enable the power generation unit to output electrical energy; and
    an electronic element electrically connected to the heat dissipation device and activated based on the electrical energy outputted from the heat dissipation device;
        wherein the heat conduction unit has a heat source end, a cooling end and a pipe wall disposed surrounding the fluid chamber, the heat conduction unit is a heat pipe, two ends of the heat pipe are configured as the heat source end and the cooling end, an opening is disposed at a side surface of the heat pipe for partially exposing the rotor from the rotor chamber, and the opening is configured for communicating the fluid chamber and the rotor chamber.

6. The electronic system of claim 5, wherein the pipe wall is configured with a capillary structure.

7. The electronic system of claim 5, wherein the rotor is a centrifugal rotor.

8. The electronic system of claim 5, wherein the power generation module comprises:
    an axis, wherein the rotor is pivotally disposed on the axis;
    a magnetic element connecting to the axis;
    a stator coil magnetically coupled to the magnetic element; and
    an output terminal connecting to the stator coil for outputting the electrical energy.

\* \* \* \* \*